(12) United States Patent
Doong et al.

(10) Patent No.: US 9,847,264 B1
(45) Date of Patent: Dec. 19, 2017

(54) METHOD FOR MANUFACTURING A SEMICONDUCTOR PRODUCT WAFER

(71) Applicant: PDF Solutions, Inc., San Jose, CA (US)

(72) Inventors: Yih-Yuh (Kelvin) Doong, Zhubei (TW); Sheng-Che Lin, Baoshan Township (TW)

(73) Assignee: PDF Solutions, Inc., San Jose, CA (US)

( * ) Notice: Subject to any disclaimer, the term of this patent is extended or adjusted under 35 U.S.C. 154(b) by 0 days.

(21) Appl. No.: 14/946,700

(22) Filed: Nov. 19, 2015

Related U.S. Application Data (60) Provisional application No. 62/081,731, filed on Nov. 19, 2014.

(51) Int. Cl.
*H01L 21/00* (2006.01)
*H01L 21/66* (2006.01)

(52) U.S. Cl.
CPC .................... *H01L 22/20* (2013.01)

(58) Field of Classification Search
CPC ........................................ H01L 22/20
USPC ........................................... 438/5
See application file for complete search history.

(56) References Cited

U.S. PATENT DOCUMENTS

2010/0055809 A1* 3/2010 Pak .................. H01L 22/34
 438/17
2016/0118217 A1* 4/2016 De .................... G01R 31/26
 250/310

* cited by examiner

*Primary Examiner* — Bradley K Smith
(74) *Attorney, Agent, or Firm* — Pillsbury Winthrop Shaw Pittman LLP (57) ABSTRACT

Improved methods for manufacturing semiconductor product wafer with the additional use of non-product masks are described. According to certain aspects of the invention, an evaluation wafer is first manufactured by utilizing at least one non-product mask to process one or more layer(s) on the evaluation wafer, and subsequently utilizing at least one unaltered product mask to process an evaluation-region-of-interest on the evaluation wafer. The evaluation-region-of-interest is evaluated by measuring the state of one or more feature(s) in the evaluation-region-of-interest using voltage contrast inspection (VCi). The measurements are then used to identify failures in the evaluation-region-of-interest. In response to identifying a failure in the evaluation-region-of-interest, the manufacturing process is improved by modifying at least one parameter associated with at least one processing step and manufacturing product wafers utilizing the at least one processing step(s) with the at least one modified parameter(s).

10 Claims, 13 Drawing Sheets

METHOD FOR MANUFACTURING A SEMICONDUCTOR PRODUCT WAFER

RELATED APPLICATIONS

This application claims priority from U.S. Provisional Application Ser. No. 62/081,731 filed Nov. 19, 2014, which is expressly incorporated herein by reference.

FIELD OF THE INVENTION

This invention relates to a method for manufacturing a semiconductor product wafer, and, particularly a method that uses non-product masks for manufacturing an improved semiconductor product wafer.

BACKGROUND OF THE INVENTION

To produce semiconductor integrated circuits, a manufacturing process (wafer process) to produce semiconductor product wafers must take place first. The manufacturing process (or wafer process) includes a large number of process steps to process semiconductor substrates (wafers). When the wafer process is completed, the wafer becomes a product wafer having a plurality of semiconductor integrated circuit chips (product chips) formed in respective chip areas on the wafer. The chips are, then, separated into individual dies at scribe lines between the chip areas. The dies are then packaged to become semiconductor integrated circuit products.

In one conventional manufacturing process of a semiconductor product wafer, a series of product masks are employed on an evaluation wafer in a series of mask-enabled processing steps. The evaluation regions of interest on the evaluation wafer are then inspected to help identify failures in any of the mask-enabled processing steps so that corrections or improvements can be made to any of the identified processing steps. However, not all of the problems or failures of the mask-enabled processing steps are observable in the evaluation wafer when using only product masks.

SUMMARY OF THE INVENTION

The present invention relates generally to semiconductor product wafer manufacturing, and more particularly to an improved manufacturing method with the additional use of non-product masks. According to certain aspects of the invention, the improved method includes first manufacturing an evaluation wafer by utilizing at least one non-product mask to process one or more layer(s) on the evaluation wafer, and subsequently utilizing at least one unaltered product mask to process an evaluation-region-of-interest on the evaluation wafer. The evaluation-region-of-interest is then evaluated by measuring the state of one or more feature(s) in the evaluation-region-of-interest using voltage contrast inspection (VCi). The measurements are then used to identify failures in the evaluation-region-of-interest. At least some failures would be unobservable by VCi without use of the non-product mask(s). In response to identifying a failure in the evaluation-region-of-interest, the manufacturing process is improved by modifying at least one parameter associated with at least one processing step and manufacturing product wafers utilizing the at least one processing step(s) with the at least one modified parameter(s).

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE PREFERRED EMBODIMENTS

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements.

Moreover, where certain elements of the present invention can be partially or fully implemented using known components, only those portions of such known components that are necessary for an understanding of the present invention will be described, and detailed descriptions of other portions of such known components will be omitted so as not to obscure the invention.

Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

In the present invention, methods for manufacturing semiconductor wafers that address the problem discussed above comprise using at least one non-product mask to process one or more layers on an evaluation wafer in addition to using product masks during the product wafer processing. According to some aspects of the invention, e-beam pads are produced and employed to observe at the product layer failures that would be unobservable in the evaluation wafer without using non-product mask.

Figure 1:
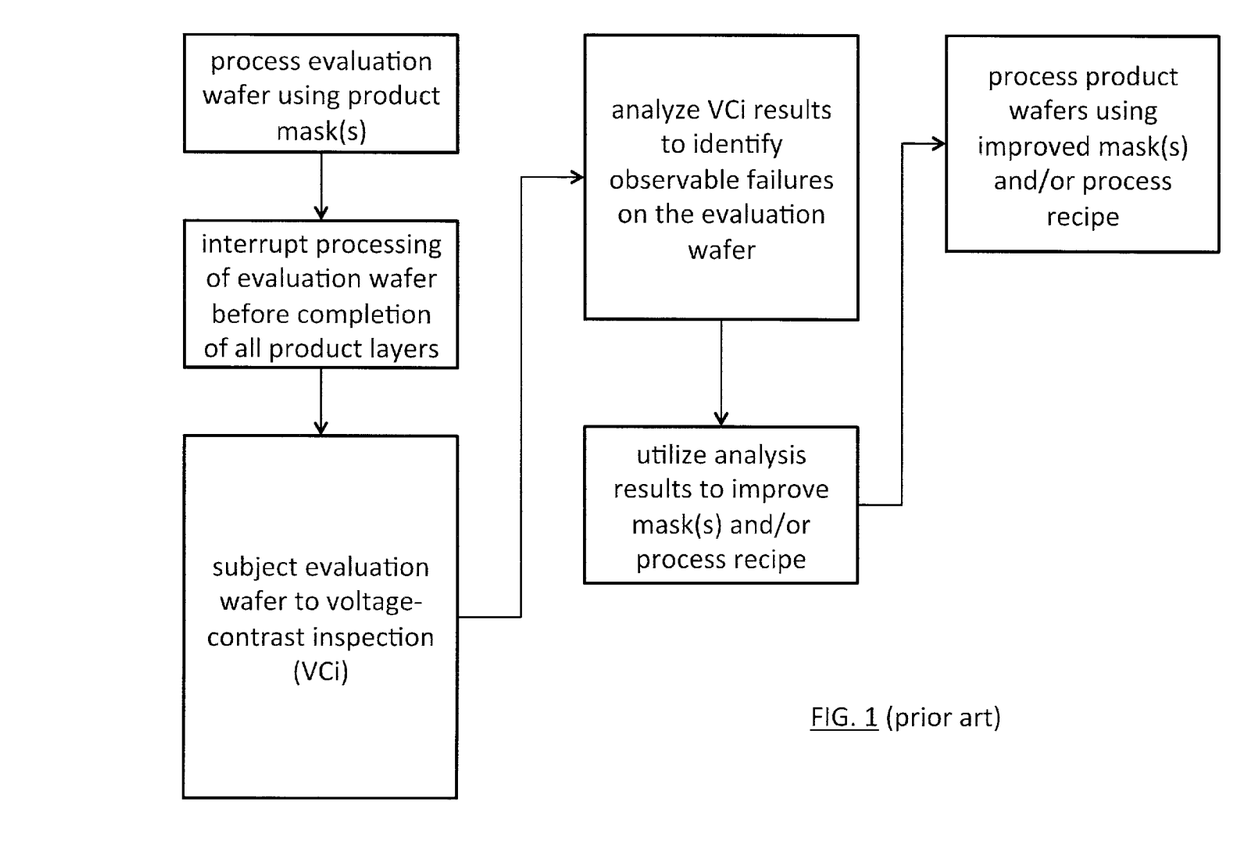
FIG. 1 illustrates a flow chart of a conventional method of manufacturing semiconductor wafer.
Figure 2:
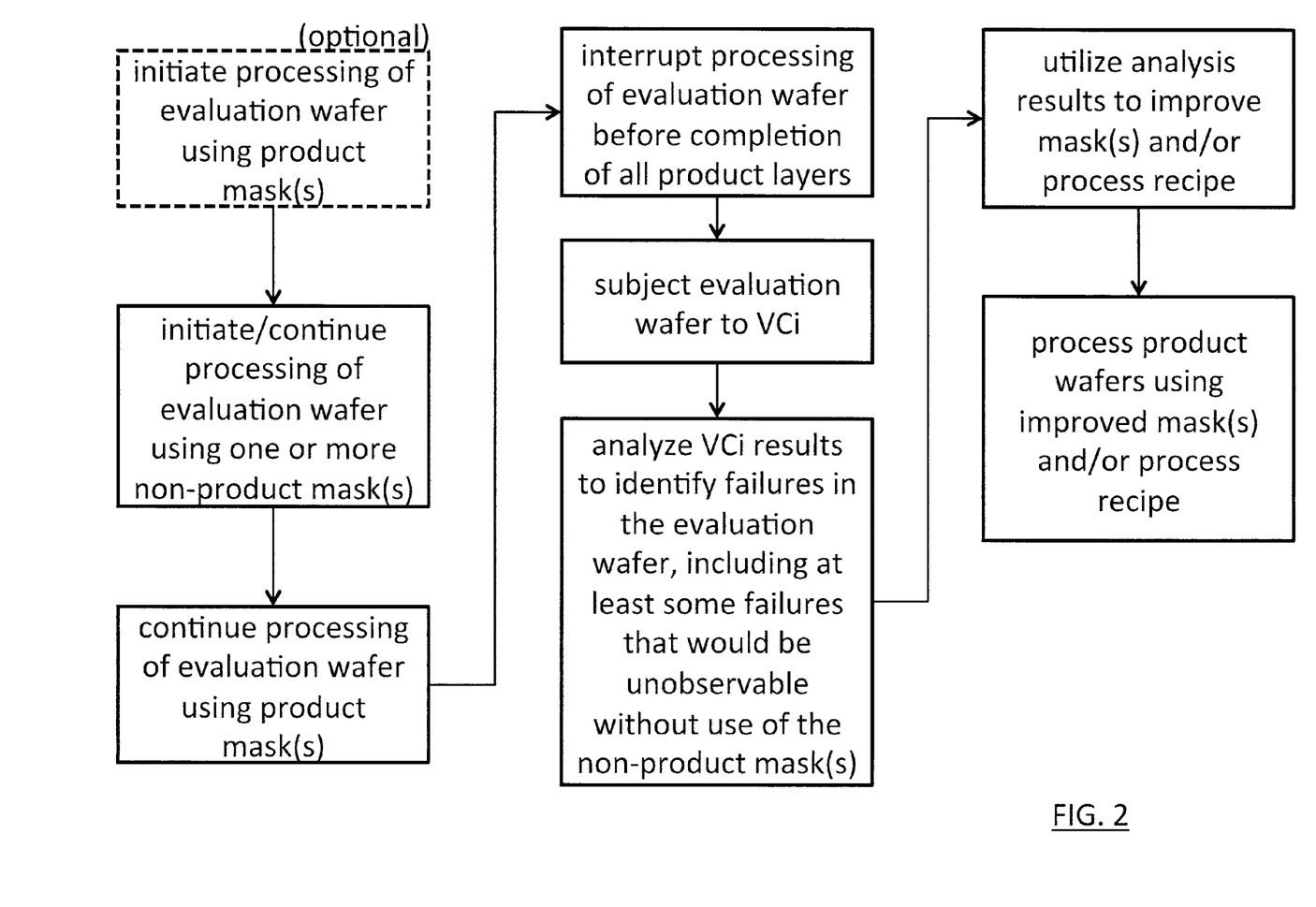
FIG. 2 is a flow chart of one exemplary embodiment of the invention.

FIG. 2 depicts one exemplary embodiment of the invention, which comprises a method for manufacturing a semiconductor product wafer, said product wafer defined by a series of product masks employed in a series of mask-enabled processing steps, said manufacturing method comprising at least the following steps:
- (i) manufacturing an evaluation wafer by:
  - (a) utilizing at least one non-product mask to process one or more layer(s) on the evaluation wafer; and,
  - (b) subsequently utilizing at least one unaltered product mask to process an evaluation-region-of-interest on the evaluation wafer;
- (ii) evaluating the evaluation-region-of-interest by:
  - (a) measuring the state of one or more feature(s) in the evaluation-region-of-interest using voltage contrast inspection (VCi);
  - (b) using measurement(s) from (ii) (a) to identify failures in the evaluation-region-of-interest, including at least some failures that would be unobservable by VCi without use of the non-product mask(s);
- (iii) in response to step (ii) (b), improving the manufacturing process by:
  - (a) modifying at least one parameter associated with at least one processing step; and,
- (iv) manufacturing product wafers utilizing the at least one processing step(s) with the at least one modified parameter(s).

Figure 3:
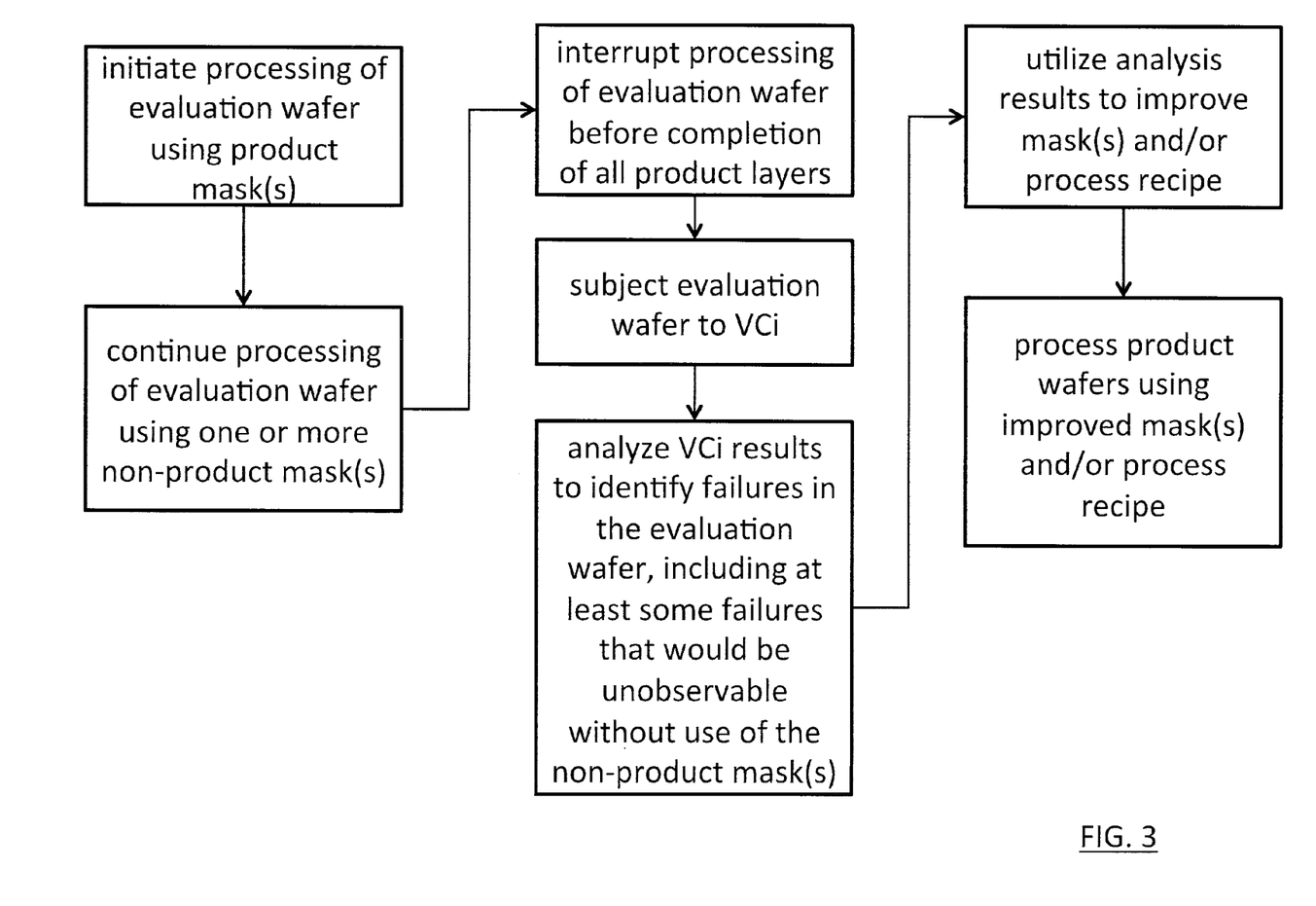
FIG. 3 is a flow chart of another exemplary embodiment of the invention.

FIG. 3 depicts another exemplary embodiment of the invention, which comprises a method for manufacturing a semiconductor product wafer, said product wafer defined by a series of product masks employed in a series of mask-enabled processing steps, said manufacturing method comprising at least the following steps:
- (i) manufacturing an evaluation wafer by:
  - (a) utilizing unaltered product mask(s) to process layer(s) on the evaluation wafer up to, and including, an evaluation-layer-of-interest; and,
  - (b) subsequently utilizing at least one non-product mask to process at least some non-product features on the evaluation wafer;
- (ii) evaluating the evaluation-layer-of-interest by:
  - (a) measuring the state of one or more feature(s) in the evaluation-layer-of-interest using voltage contrast inspection (VCi);
  - (b) using measurement(s) from (ii) (a) to identify failures in the evaluation-layer-of-interest, including at least some failures that would be unobservable by VCi without use of the non-product mask(s);
- (iii) in response to step (ii)(b), improving the manufacturing process by:
  - (a) modifying at least one parameter associated with at least one processing step; and,
- (iv) manufacturing product wafers utilizing the at least one processing step(s) with the at least one modified parameter(s).

Figure 4:
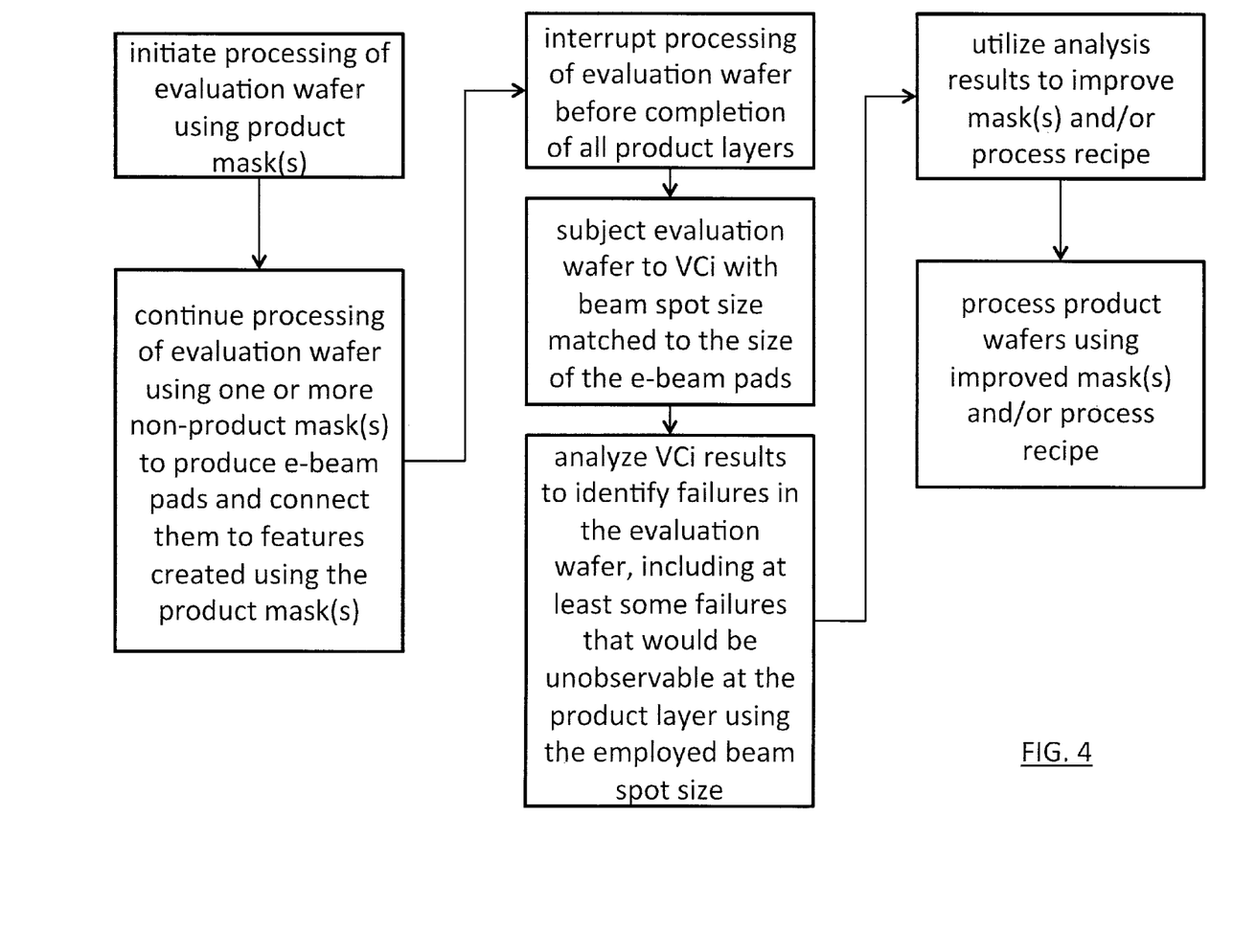
FIG. 4 is a flow chart of a third exemplary embodiment of the invention.

FIG. 4 depicts another exemplary embodiment of the invention, which comprises a method for manufacturing a semiconductor product wafer, said product wafer defined by a series of product masks employed in a series of mask-enabled processing steps, said manufacturing method comprising at least the following steps:
- (i) manufacturing an evaluation wafer by:
  - (a) utilizing unaltered product mask(s) to process layer(s) on the evaluation wafer up to, and including, an evaluation-layer-of-interest; and,
  - (b) subsequently utilizing at least one non-product mask to produce e-beam pads on the evaluation wafer and connect them to features in the evaluation-layer-of-interest;
- (ii) evaluating the evaluation-layer-of-interest by:
  - (a) measuring the state of one or more e-beam pads using voltage contrast inspection (VCi) with a beam spot size matched to the e-beam pads;
  - (b) using measurement(s) from (ii) (a) to identify failures in the evaluation-layer-of-interest, including at least some failures that would be unobservable by VCi if directly scanned in the evaluation-layer-of-interest with the same beam spot size used to measure the state(s) of the e-beam pad(s);
- (iii) in response to step (ii)(b), improving the manufacturing process by:
  - (a) modifying at least one parameter associated with at least one processing step; and,
- (iv) manufacturing product wafers utilizing the at least one processing step(s) with the at least one modified parameter(s).

Figure 5:
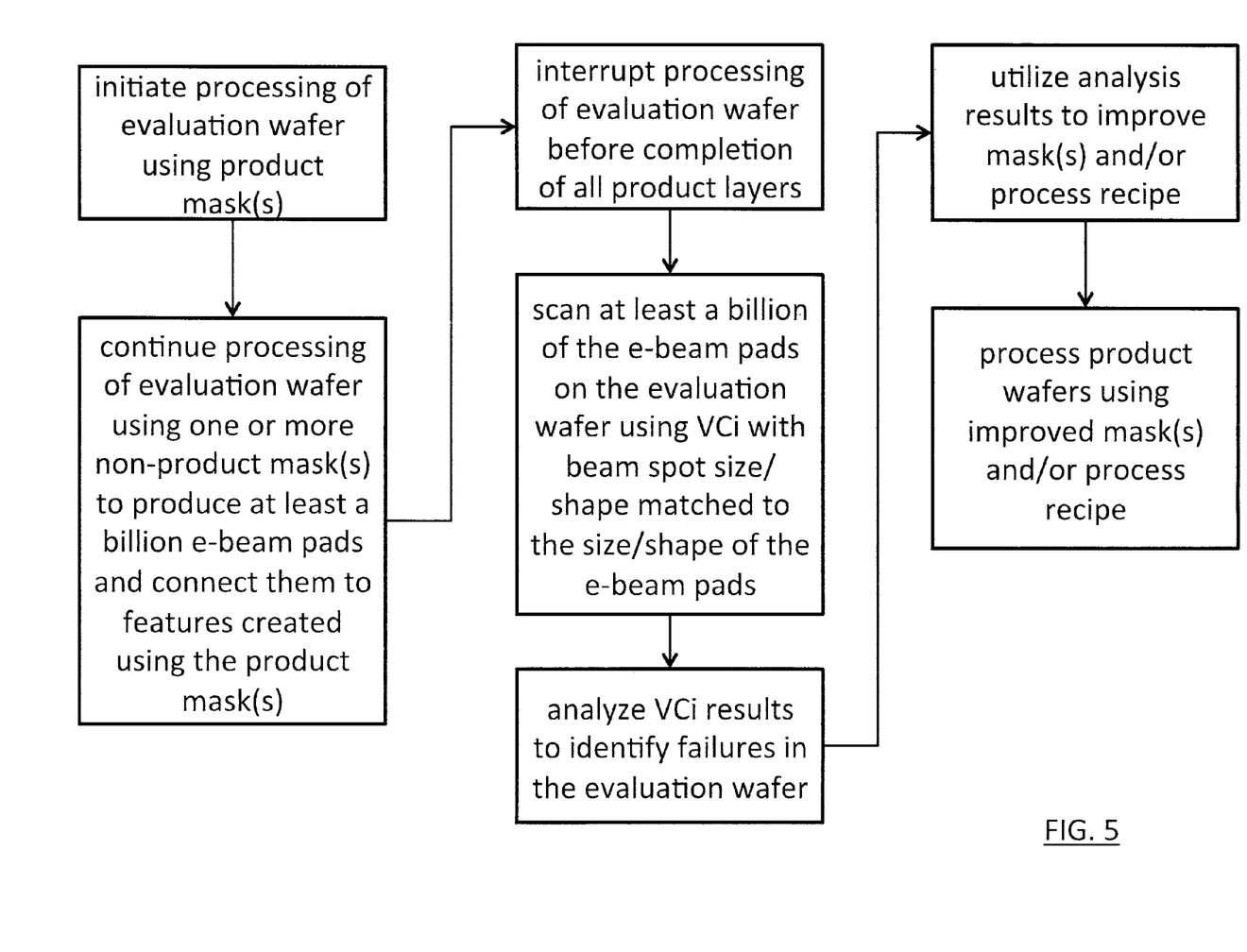
FIG. 5 is a flow chart of a fourth exemplary embodiment of the invention.

FIG. 5 depicts another exemplary embodiment of the invention, which comprises a method for manufacturing a semiconductor product wafer, said product wafer defined by a series of product masks employed in a series of mask-enabled processing steps, said manufacturing method comprising at least the following steps:
- (i) manufacturing an evaluation wafer by:
  - (a) utilizing unaltered product mask(s) to process layer(s) on the evaluation wafer up to, and including, an evaluation-layer-of-interest; and,
  - (b) subsequently utilizing at least one non-product mask to produce at least a billion e-beam pads on the evaluation wafer and connect them to features in the evaluation-layer-of-interest;
- (ii) evaluating the evaluation-layer-of-interest by:
  - (a) measuring the state of at least a billion of the e-beam pads using voltage contrast inspection (VCi) with a beam spot size/shape matched to the size/shape of the e-beam pads;
  - (b) using measurement(s) from (ii) (a) to identify failures in the evaluation-layer-of-interest;
- (iii) in response to step (ii)(b), improving the manufacturing process by:
  - (a) modifying at least one parameter associated with at least one processing step; and,
- (iv) manufacturing product wafers utilizing the at least one processing step(s) with the at least one modified parameter(s).

Figure 6:
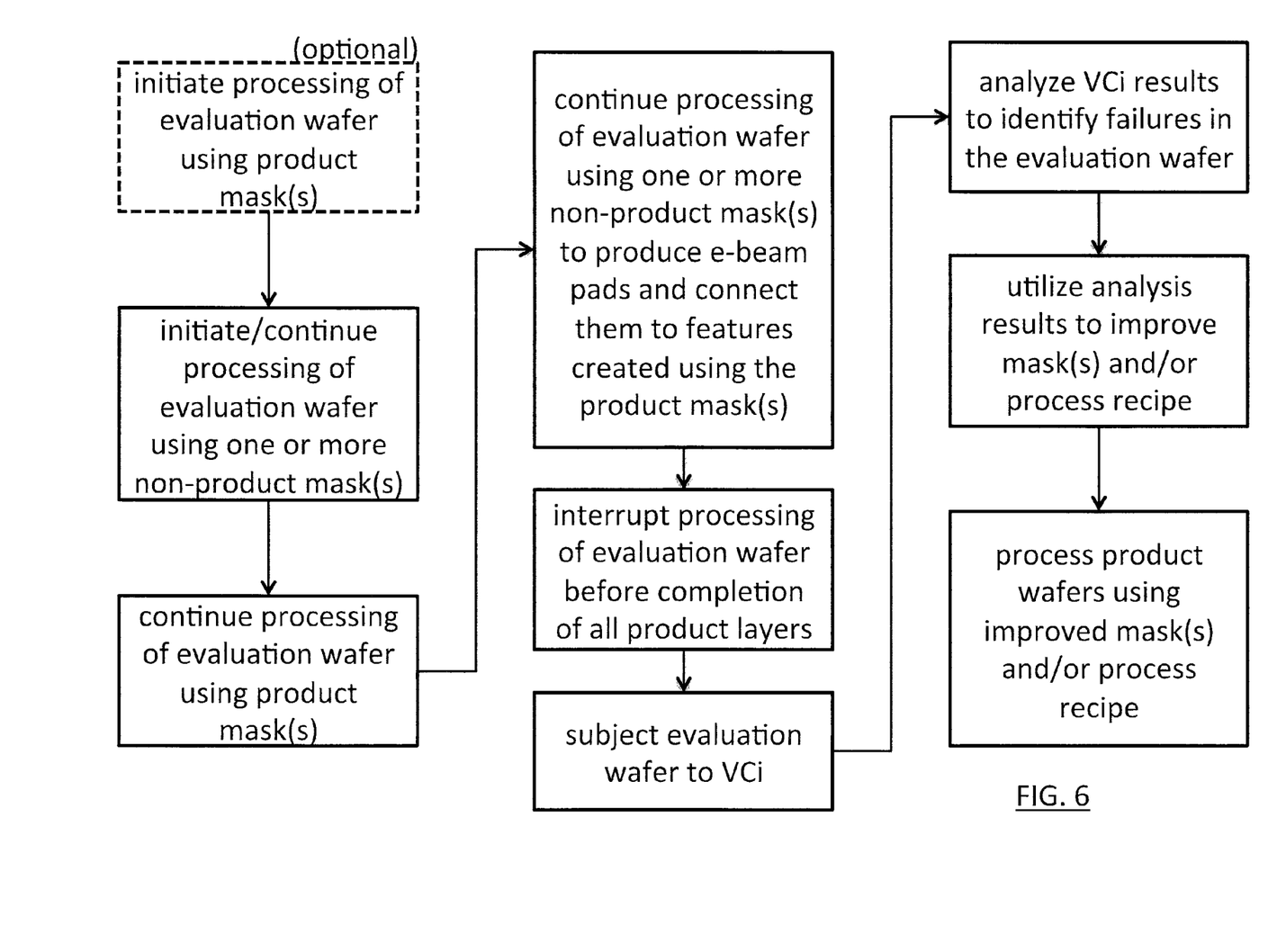
FIG. 6 is a flow chart of fifth exemplary embodiment of the invention.

FIG. 6 depicts another exemplary embodiment of the invention, which comprises a method for manufacturing a semiconductor product wafer, said product wafer defined by a series of product masks employed in a series of mask-enabled processing steps, said manufacturing method comprising at least the following steps:
- (i) manufacturing an evaluation wafer by:
  - (a) utilizing at least one non-product mask to process one or more layer(s) on the evaluation wafer;
  - (b) subsequently utilizing at least one unaltered product mask to process an evaluation-region-of-interest on the evaluation wafer; and, (c) subsequently utilizing at least one non-product mask to process e-beam pads on the evaluation wafer and connect them to features in the evaluation-region-of-interest;
(ii) evaluating the evaluation-region-of-interest by:
  (a) measuring the state of one or more e-beam pads using voltage contrast inspection;
  (b) using measurement(s) from (ii) (a) to identify failures in the evaluation-region-of-interest;
(iii) in response to step (ii)(b), improving the manufacturing process by:
  (a) modifying at least one parameter associated with at least one processing step; and,
(iv) manufacturing product wafers utilizing the at least one processing step(s) with the at least one modified parameter(s).

Figure 7:
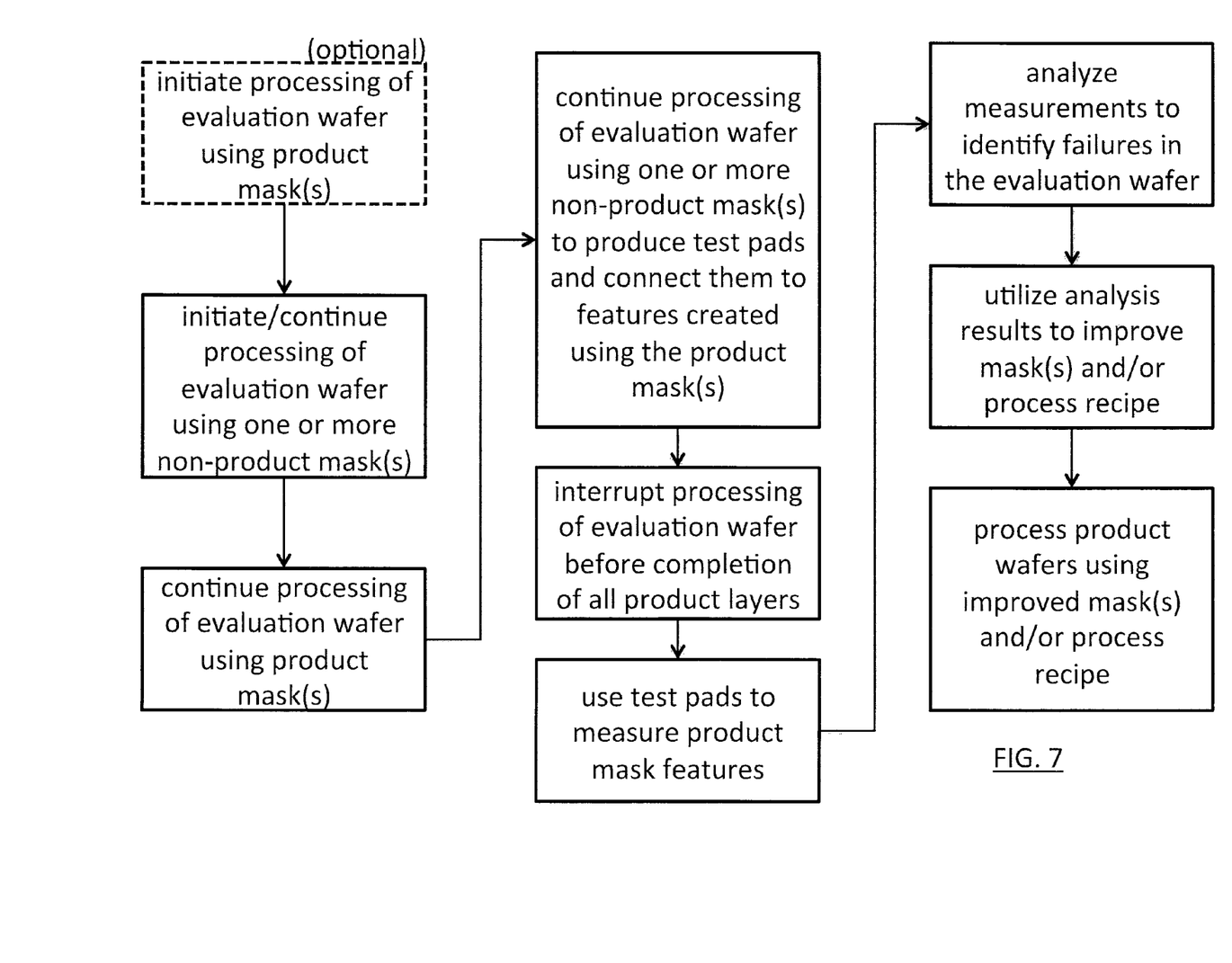
FIG. 7 is a flow chart of a sixth exemplary embodiment of the invention.

FIG. 7 depicts another exemplary embodiment of the invention, which comprises a method for manufacturing a semiconductor product wafer, said product wafer defined by a series of product masks employed in a series of mask-enabled processing steps, said manufacturing method comprising at least the following steps:
(i) manufacturing an evaluation wafer by:
  (a) utilizing at least one non-product mask to process one or more layer(s) on the evaluation wafer;
  (b) subsequently utilizing at least one unaltered product mask to process an evaluation-region-of-interest on the evaluation wafer; and,
  (c) subsequently utilizing at least one non-product mask to process test pads on the evaluation wafer and connect them to features in the evaluation-region-of-interest;
(ii) evaluating the evaluation-region-of-interest by:
  (a) measuring the state of one or more test pads;
  (b) using measurement(s) from (ii) (a) to identify failures in the evaluation-region-of-interest;
(iii) in response to step (ii)(b), improving the manufacturing process by:
  (a) modifying at least one parameter associated with at least one processing step; and,
(iv) manufacturing product wafers utilizing the at least one processing step(s) with the at least one modified parameter(s).

Figure 8:
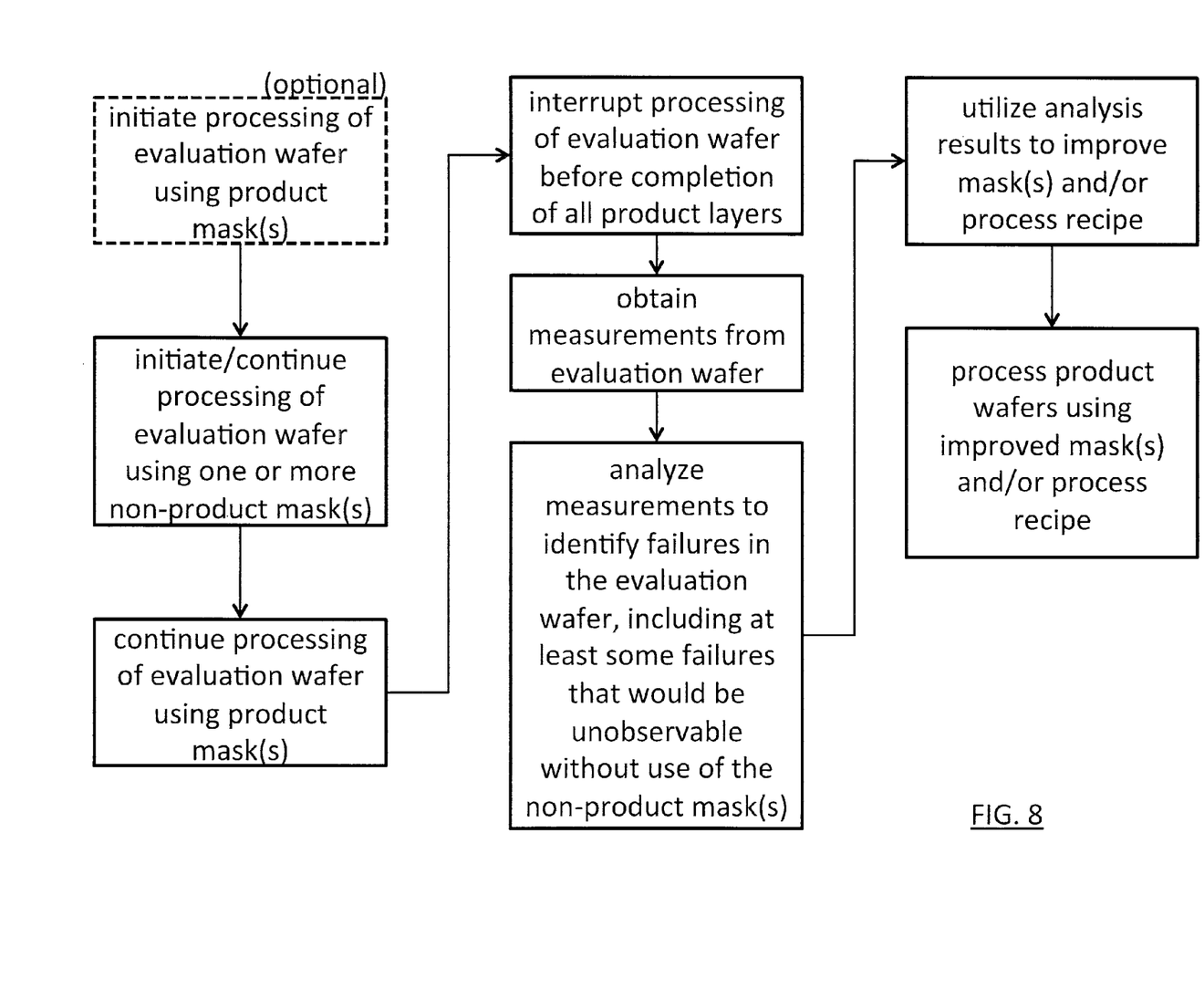
FIG. 8 is a flow chart of a seventh exemplary embodiment of the invention.

FIG. 8 depicts another exemplary embodiment of the invention, which comprises a method for manufacturing a semiconductor product wafer, said product wafer defined by a series of product masks employed in a series of mask-enabled processing steps, said manufacturing method comprising at least the following steps:
(i) manufacturing an evaluation wafer by:
  (a) utilizing at least one non-product mask to process one or more layer(s) on the evaluation wafer; and,
  (b) subsequently utilizing at least one unaltered product mask to process an evaluation-region-of-interest on the evaluation wafer;
(ii) evaluating the evaluation-region-of-interest by:
  (a) measuring the state of one or more feature(s) in the evaluation-region-of-interest;
  (b) using measurement(s) from (ii) (a) to identify failures in the evaluation-region-of-interest, including at least some failures that would be unobservable without use of the non-product mask(s);
(iii) in response to step (ii)(b), improving the manufacturing process by:
  (a) modifying at least one parameter associated with at least one processing step; and,
(iv) manufacturing product wafers utilizing the at least one processing step(s) with the at least one modified parameter(s).

Modifying at least one parameter associated with at least one processing step may comprise modifying at least one product mask.

Modifying at least one parameter associated with at least one processing step may also comprise modifying the process recipe associated with said at least one processing step.

Determining the status of the e-beam pads/features may comprise determining whether the pads/features are charged or discharged.

Determining the status of the e-beam pads/features may also comprise determining whether the pads/features appear as bright or dark on VCi.

Determining the status of the e-beam pads may also comprise scanning at a low resolution to determine whether at least one of the pads is charged.

Determining the status of the e-beam pads/features may also comprise inferring leakage or resistance to ground from the measured charge/discharge state of the pads/features.

Determining the status of the e-beam pads/features may also comprise inferring leakage or resistance to between pads/features by comparing the measured charge/discharge state of the pads/features.

Determining the status of the e-beam pads/features may also comprise determining a non-binary (greyscale) value indicative of the measured charge or brightness of the pads/features.

Steps (i)-(ii) above may be performed at least twice (or three time, four, or more times) before proceeding to steps (iii)-(iv).

Figure 9:
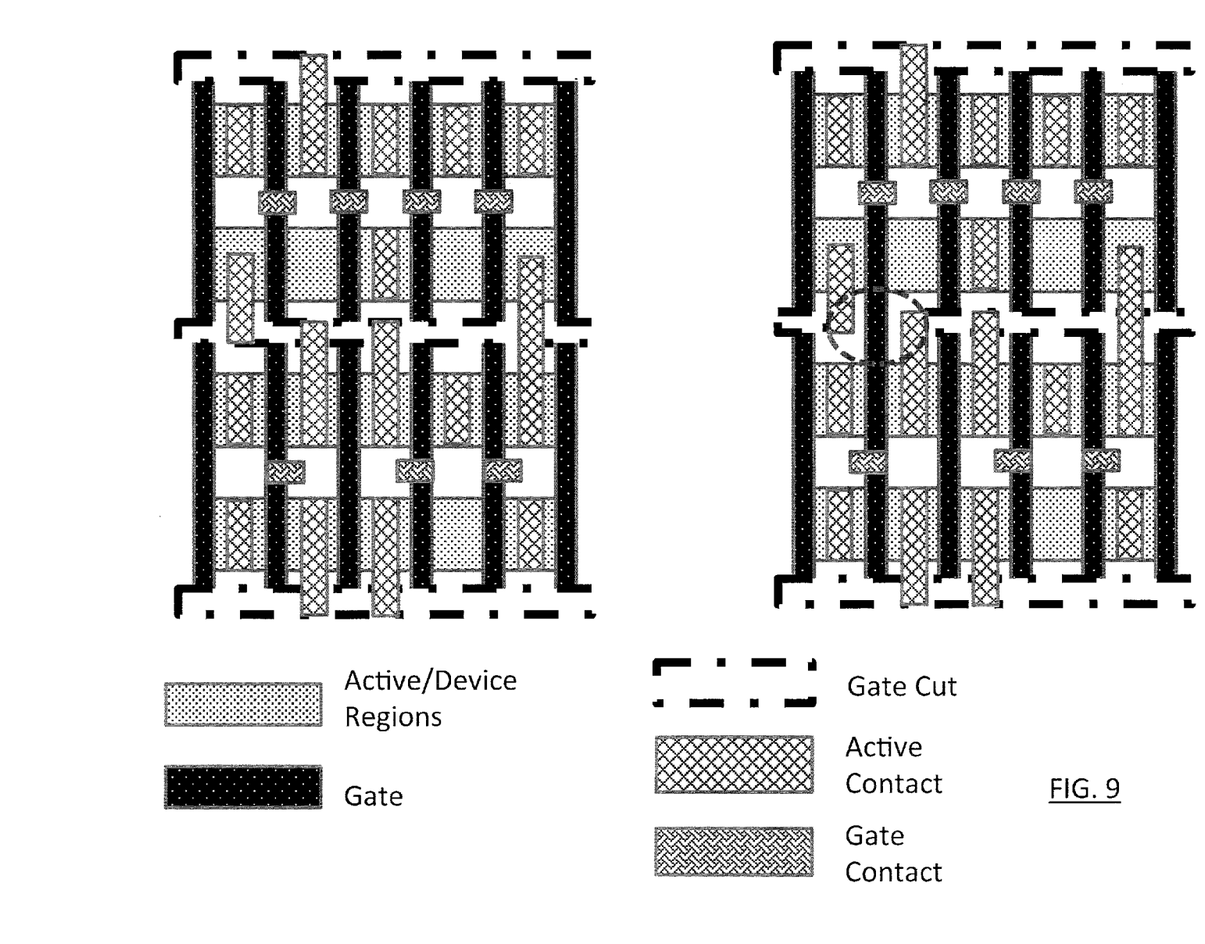
FIG. 9 shows a non-product (Gate Cut) mask used to connect two (Gate) features according to one aspect of the invention.

The non-product mask(s) can be used to electrically connect selected features in the evaluation-region/layer-of-interest that would otherwise be disconnected in a product wafer manufactured using unaltered product masks. FIG. 9 shows such an example in which a non-product (Gate Cut) mask is used to connect two (Gate) features that would be otherwise unconnected in the product wafer.

Figure 10A:
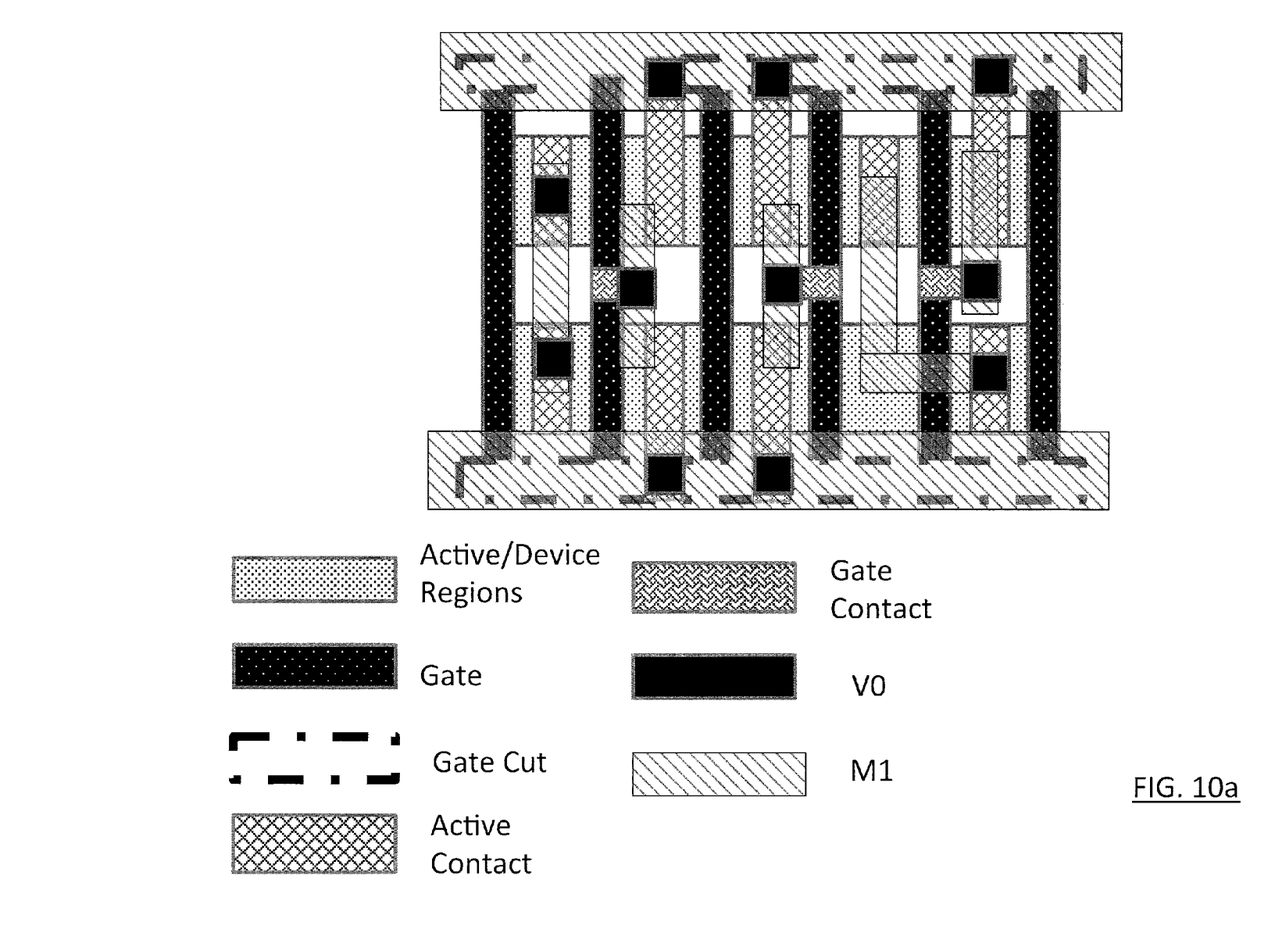
FIGS. 10a and 10b show a non-product (VO) mask used to disconnect a connection to an (Active Contact) feature according to one aspect of the invention.
Figure 10B:
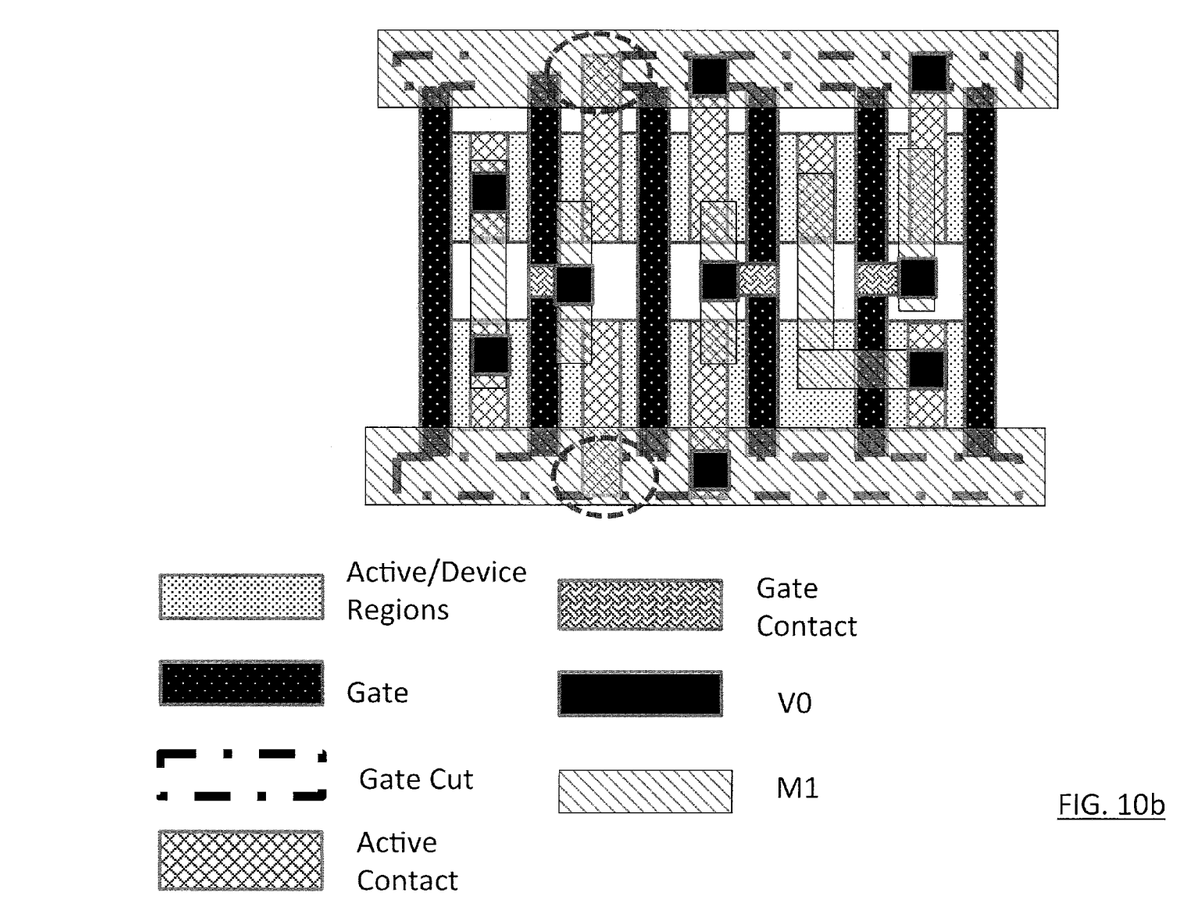

The non-product mask(s) can also be used to electrically isolate selected features in the evaluation-region/layer-of-interest that would otherwise be connected in a product wafer manufactured using unaltered product masks. FIGS. 10a-b show such an example in which a non-product (VO) mask is used to disconnect a connection to an (Active Contact) feature that would otherwise be connected in the product wafer.

Figure 11A:
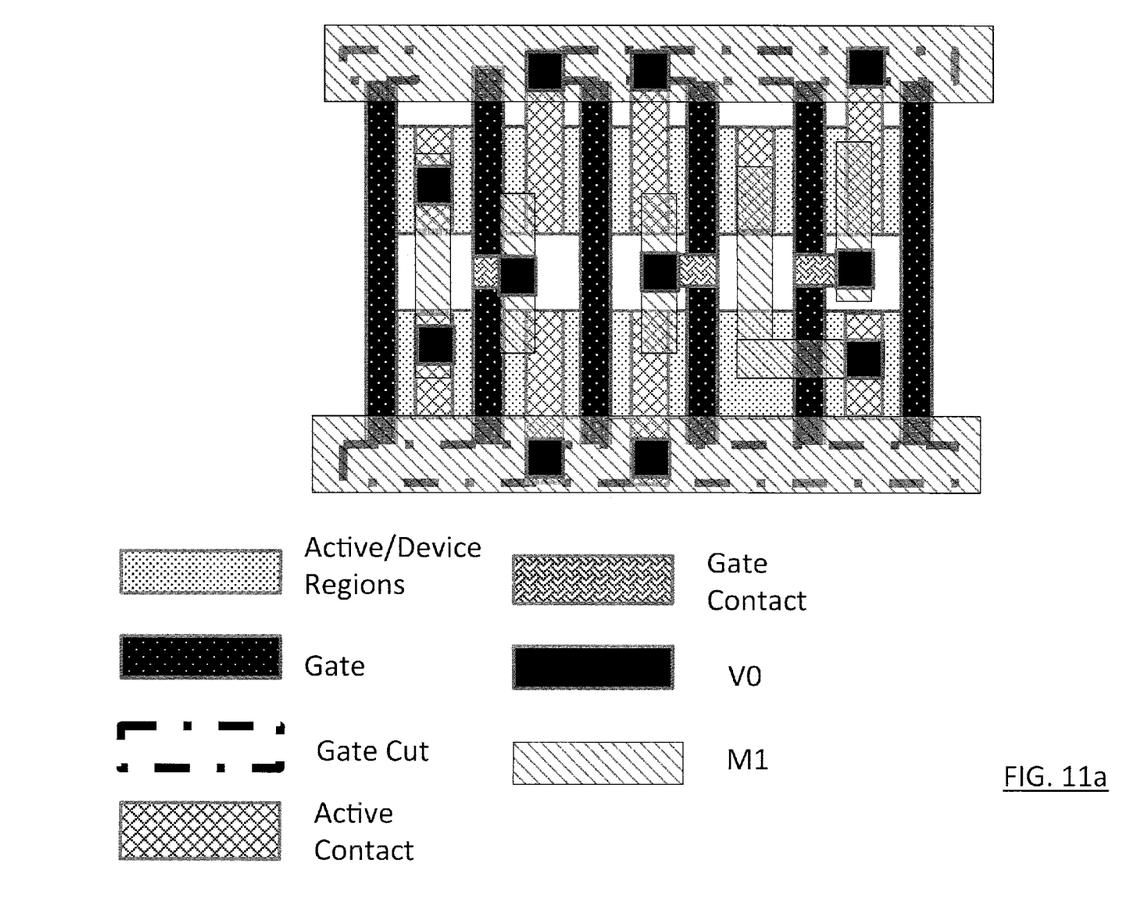
FIGS. 11a and 11b show a non-product (M1) mask used to ground a (Poly) feature according to one aspect of the invention.
Figure 11B:
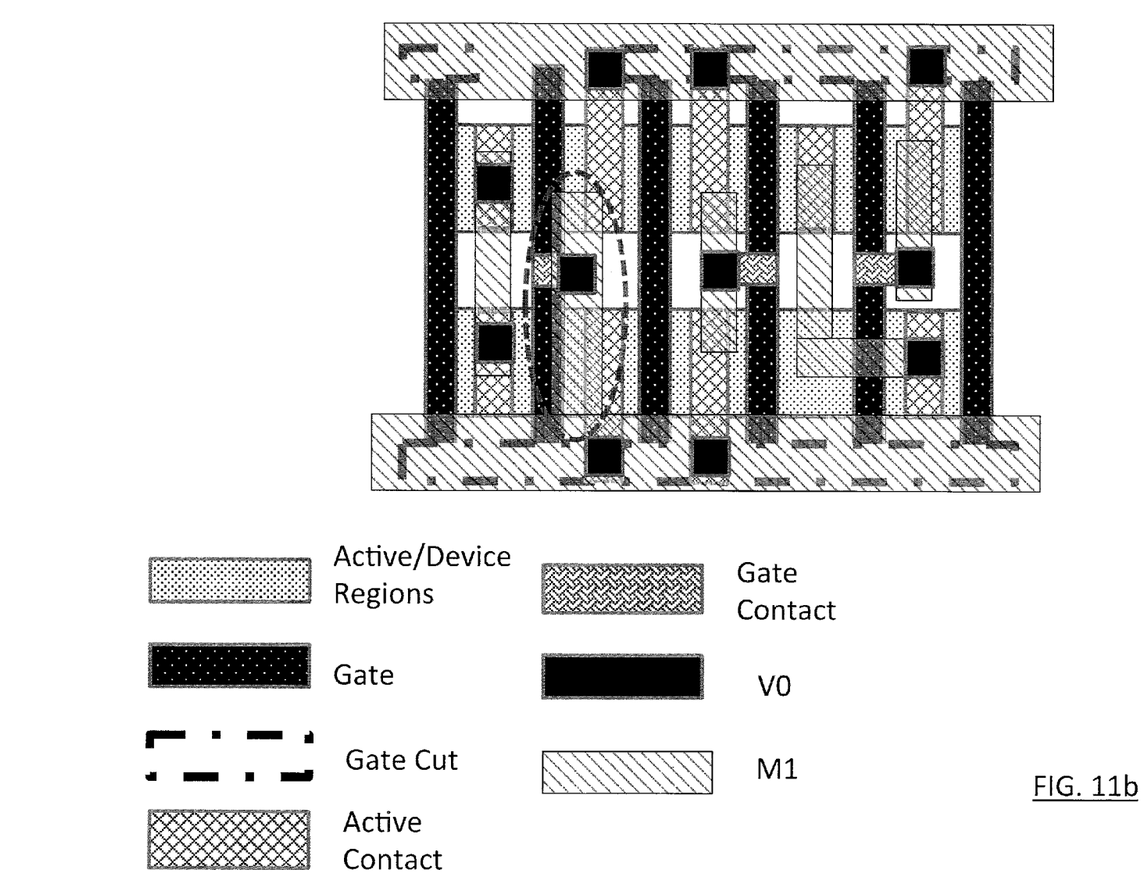

The non-product mask(s) may also be used to electrically ground selected features in the evaluation-region/layer-of-interest that would otherwise be ungrounded in a product wafer manufactured using unaltered product masks. FIGS. 11a-b show such an example in which a non-product (M1) mask is used to ground a (Poly) feature that would otherwise be ungrounded in the product wafer.

Although the present invention has been particularly described with reference to the preferred embodiments thereof, it should be readily apparent to those of ordinary skill in the art that changes and modifications in the form and details may be made without departing from the spirit and scope of the invention. It is intended that the appended claims encompass such changes and modifications.

What is claimed:

1. A method for manufacturing a semiconductor product wafer, said product wafer defined by a series of product masks employed in a series of mask-enabled processing steps, said manufacturing method comprising at least the following steps:

(i) manufacturing an evaluation wafer by:
  (a) utilizing unaltered product mask(s) to process layer(s) on the evaluation wafer up to, and including, an evaluation-layer-of-interest; and,
  (b) subsequently utilizing at least one non-product mask to produce e-beam pads on the evaluation wafer and connect them to features in the evaluation-layer-of-interest;
(ii) evaluating the evaluation-layer-of-interest by:
  (a) measuring the state of one or more e-beam pads using voltage contrast inspection (VCi) with a beam spot size matched to the e-beam pads;
  (b) using measurement(s) from (ii) (a) to identify failures in the evaluation-layer-of-interest, including at least some failures that would be unobservable by VCi if directly scanned in the evaluation-layer-of-interest with the same beam spot size used to measure the state(s) of the e-beam pad(s);
(iii) in response to step (ii)(b), improving the manufacturing process by:
  (a) modifying at least one parameter associated with at least one processing step; and,
(iv) manufacturing product wafers utilizing the at least one processing step(s) with the at least one modified parameter(s).

2. The method of claim 1, wherein measuring the state of one or more e-beam pads comprises determining whether the pads/features are charged or discharged.

3. The method of claim 1, wherein measuring the state of one or more e-beam pads comprises determining whether the pads/features appear as bright or dark on VCi.

4. The method of claim 1, wherein measuring the state of one or more e-beam pads comprises scanning at a low resolution to determine whether at least one of the pads is charged.

5. The method of claim 1, wherein measuring the state of one or more e-beam pads comprises inferring leakage or resistance to ground from the measured charge/discharge state of the pads/features.

6. The method of claim 1, wherein measuring the state of one or more e-beam pads comprises inferring leakage or resistance to between pads/features by comparing the measured charge/discharge state of the pads/features.

7. The method of claim 1, wherein measuring the state of one or more e-beam pads comprises determining a non-binary (greyscale) value indicative of the measured charge or brightness of the pads/features.

8. A method for manufacturing a semiconductor product wafer, said product wafer defined by a series of product masks employed in a series of mask-enabled processing steps, said manufacturing method comprising at least the following steps:
(i) manufacturing an evaluation wafer by:
  (a) utilizing unaltered product mask(s) to process layer(s) on the evaluation wafer up to, and including, an evaluation-layer-of-interest; and,
  (b) subsequently utilizing at least one non-product mask to produce at least a billion e-beam pads on the evaluation wafer and connect them to features in the evaluation-layer-of-interest;
(ii) evaluating the evaluation-layer-of-interest by:
  (a) measuring the state of at least a billion of the e-beam pads using voltage contrast inspection (VCi) with a beam spot size/shape matched to the size/shape of the e-beam pads;
  (b) using measurement(s) from (ii) (a) to identify failures in the evaluation-layer-of-interest;
(iii) in response to step (ii)(b), improving the manufacturing process by:
  (a) modifying at least one parameter associated with at least one processing step; and,
(iv) manufacturing product wafers utilizing the at least one processing step(s) with the at least one modified parameter(s).

9. A method for manufacturing a semiconductor product wafer, said product wafer defined by a series of product masks employed in a series of mask-enabled processing steps, said manufacturing method comprising at least the following steps:
(i) manufacturing an evaluation wafer by:
  (a) utilizing at least one non-product mask to process one or more layer(s) on the evaluation wafer;
  (b) subsequently utilizing at least one unaltered product mask to process an evaluation-region-of-interest on the evaluation wafer; and,
  (c) subsequently utilizing at least one non-product mask to process e-beam pads on the evaluation wafer and connect them to features in the evaluation-region-of-interest;
(ii) evaluating the evaluation-region-of-interest by:
  (a) measuring the state of one or more e-beam pads using voltage contrast inspection;
  (b) using measurement(s) from (ii) (a) to identify failures in the evaluation-region-of-interest;
(iii) in response to step (ii)(b), improving the manufacturing process by:
  (a) modifying at least one parameter associated with at least one processing step; and,
(iv) manufacturing product wafers utilizing the at least one processing step(s) with the at least one modified parameter(s).

10. A method for manufacturing a semiconductor product wafer, said product wafer defined by a series of product masks employed in a series of mask-enabled processing steps, said manufacturing method comprising at least the following steps:
(i) manufacturing an evaluation wafer by:
  (a) utilizing at least one non-product mask to process one or more layer(s) on the evaluation wafer;
  (b) subsequently utilizing at least one unaltered product mask to process an evaluation-region-of-interest on the evaluation wafer; and,
  (c) subsequently utilizing at least one non-product mask to process test pads on the evaluation wafer and connect them to features in the evaluation-region-of-interest;
(ii) evaluating the evaluation-region-of-interest by:
  (a) measuring the state of one or more test pads;
  (b) using measurement(s) from (ii) (a) to identify failures in the evaluation-region-of-interest;
(iii) in response to step (ii)(b), improving the manufacturing process by:
  (a) modifying at least one parameter associated with at least one processing step; and,
(iv) manufacturing product wafers utilizing the at least one processing step(s) with the at least one modified parameter(s).

* * * * *